United States Patent
Itayama

(10) Patent No.: US 11,611,034 B2
(45) Date of Patent: Mar. 21, 2023

(54) PIEZOELECTRIC ELEMENT AND LIQUID DROPLET EJECTION HEAD

(71) Applicant: Seiko Epson Corporation, Toyko (JP)

(72) Inventor: Yasuhiro Itayama, Kai (JP)

(73) Assignee: SEIKO EPSON CORPORATION

(*) Notice: Subject to any disclaimer, the term of this patent is extended or adjusted under 35 U.S.C. 154(b) by 0 days.

(21) Appl. No.: 17/213,322

(22) Filed: Mar. 26, 2021

(65) Prior Publication Data

US 2021/0305483 A1 Sep. 30, 2021

(30) Foreign Application Priority Data

Mar. 27, 2020 (JP) .............................. JP2020-057303

(51) Int. Cl.
| | |
|---|---|
| *B41J 2/14* | (2006.01) |
| *H01L 41/083* | (2006.01) |
| *H01L 41/09* | (2006.01) |
| *H01L 41/187* | (2006.01) |

(52) U.S. Cl.
CPC ........ *H01L 41/083* (2013.01); *B41J 2/14233* (2013.01); *H01L 41/0973* (2013.01); *H01L 41/1876* (2013.01); *B41J 2002/14258* (2013.01)

(58) Field of Classification Search
None
See application file for complete search history.

(56) References Cited

U.S. PATENT DOCUMENTS

| 8,053,955 | B2 | 11/2011 | Takahashi et al. | |
|---|---|---|---|---|
| 10,243,135 | B2 | 3/2019 | Fukui et al. | |
| 2003/0222947 | A1* | 12/2003 | Tomozawa | H01L 41/0815 347/68 |
| 2004/0207296 | A1* | 10/2004 | Namerikawa | H01L 41/0831 310/367 |
| 2011/0273516 | A1* | 11/2011 | Miyazawa | B41J 2/14201 347/68 |
| 2014/0339961 | A1* | 11/2014 | Maejima | G11B 5/483 310/358 |
| 2019/0006574 | A1* | 1/2019 | Mardilovich | H01L 41/0838 |
| 2020/0171826 | A1* | 6/2020 | Tanaka | B41J 2/14233 |

FOREIGN PATENT DOCUMENTS

| JP | 2009-231405 A | 10/2009 |
|---|---|---|
| JP | 2011-071410 A | 4/2011 |
| JP | 2016-186965 A | 10/2016 |

* cited by examiner

*Primary Examiner* — Erica S Lin

(74) *Attorney, Agent, or Firm* — Harness, Dickey & Pierce, P.L.C.

(57) ABSTRACT

There is provided a piezoelectric element including: a substrate; a first electrode formed at a first substrate surface of the substrate in a first direction; a first piezoelectric layer that is formed at the first electrode and that includes a flat surface portion along the first substrate surface and an inclined surface portion inclined with respect to the flat surface portion; a second piezoelectric layer that is formed at the inclined surface portion 170a and whose thickness is smaller than a thickness of the flat surface portion of the first piezoelectric layer; and a second electrode formed at at least the flat surface portion.

7 Claims, 7 Drawing Sheets

PIEZOELECTRIC ELEMENT AND LIQUID DROPLET EJECTION HEAD

The present application is based on, and claims priority from JP Application Serial Number 2020-057303, filed Mar. 27, 2020, the disclosure of which is hereby incorporated by reference herein in its entirety.

BACKGROUND

1. Technical Field

The present disclosure relates to a piezoelectric element and a liquid droplet ejection head.

2. Related Art

In the related art, a piezoelectric element including a substrate, a piezoelectric layer, and an electrode that applies a voltage to the piezoelectric layer is used. As an example of such a piezoelectric element, for example, JP-A-2011-71410 discloses a piezoelectric element including a substrate, a first electrode, a piezoelectric layer formed on the first electrode, and a second electrode formed on the piezoelectric layer.

However, in a piezoelectric element in the related art including a substrate, a piezoelectric layer, and an electrode, a hole may be formed at a surface of the piezoelectric layer, and foreign substance such as water may intrude into the hole. When the foreign substance such as water intrudes into the hole at the surface of the piezoelectric layer at the time of manufacturing the piezoelectric element or the like, a leakage current may be generated or the piezoelectric element may be damaged. As the piezoelectric element is driven, stress may be concentrated at the hole, and the piezoelectric element may be damaged. JP-A-2011-71410 discloses a configuration in which a protective film such as a resin is disposed on a surface of the piezoelectric layer. However, depending on a constituent material and a forming method of the protective film, a material of the protective film may not properly intrude into the hole, and the protective film may be peeled off as the piezoelectric element is driven. Therefore, it is desired to appropriately fill the hole on the surface of the piezoelectric layer. When the piezoelectric layer includes a flat surface portion parallel to the substrate and an inclined surface portion inclined with respect to the substrate, the above-described problem is likely to occur particularly on the inclined surface portion.

SUMMARY

A piezoelectric element according to the present disclosure for solving the problem includes: a substrate; a first electrode formed at a first substrate surface of the substrate in a first direction; a first piezoelectric layer that is formed at the first electrode and that includes a flat surface portion along the first substrate surface and an inclined surface portion inclined from the flat surface portion toward the first substrate surface; a second piezoelectric layer that is formed at the inclined surface portion and whose thickness is smaller than a thickness of the flat surface portion of the first piezoelectric layer; and a second electrode formed at at least the flat surface portion.

DESCRIPTION OF EXEMPLARY EMBODIMENTS

Figure 1:
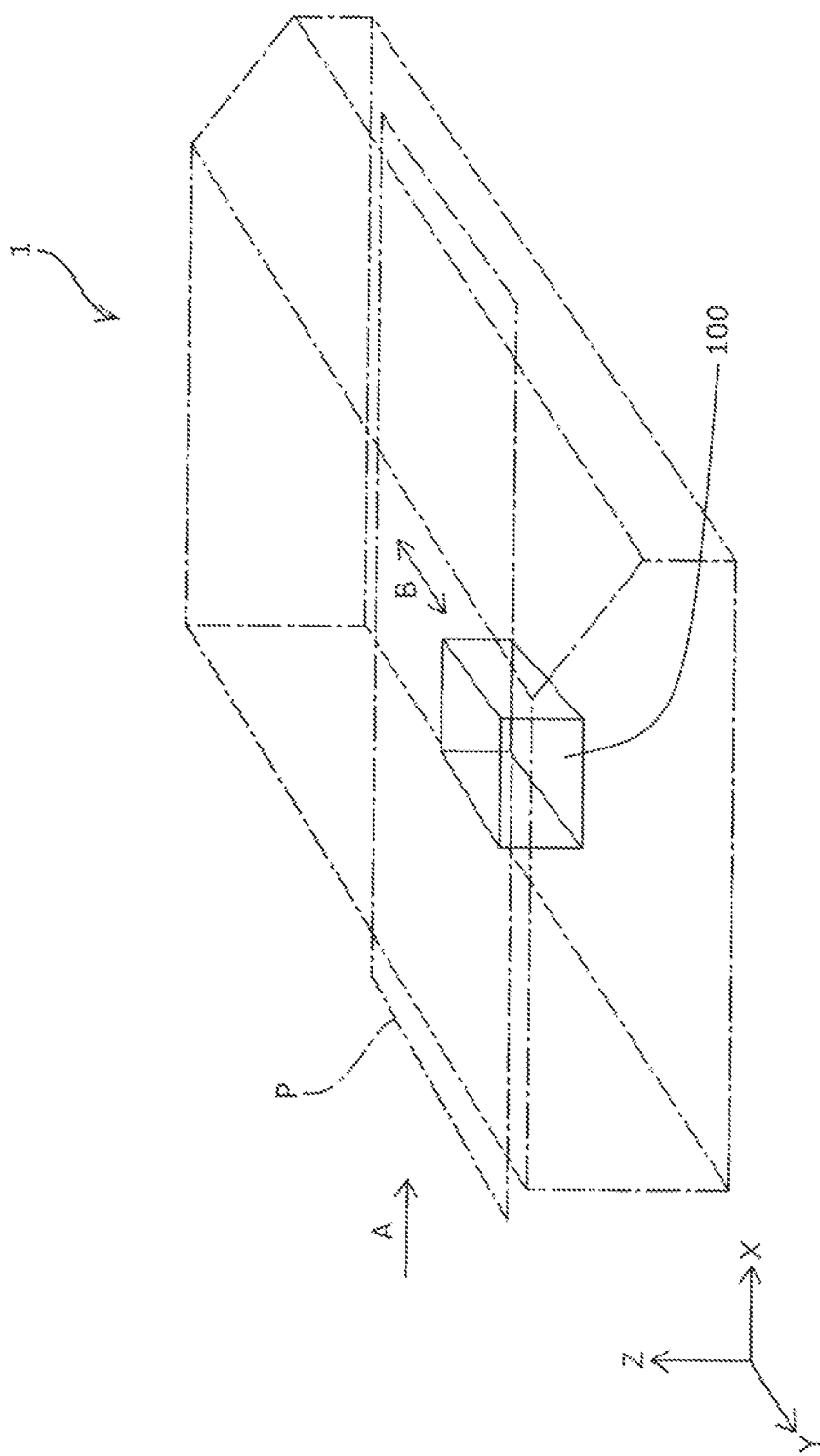
FIG. 1 is a schematic view of a recording apparatus according to a first embodiment including a liquid droplet ejection head according to an embodiment of the present disclosure.

First, the present disclosure will be briefly described.

A piezoelectric element according to a first aspect of the present disclosure for solving the problem includes: a substrate; a first electrode formed at a first substrate surface of the substrate in a first direction; a first piezoelectric layer that is formed at the first electrode and that includes a flat surface portion along the first substrate surface and an inclined surface portion inclined from the flat surface portion toward the first substrate surface; a second piezoelectric layer that is formed at the inclined surface portion and whose thickness is smaller than a thickness of the flat surface portion of the first piezoelectric layer; and a second electrode formed at at least the flat surface portion.

According to the present aspect, the second piezoelectric layer whose thickness is smaller than a thickness of the flat surface portion of the first piezoelectric layer covers the inclined surface portion of the first piezoelectric layer. The second piezoelectric layer thinner than the first piezoelectric layer covers the inclined surface portion, so that a constituent material of the second piezoelectric layer intrudes into a hole on the inclined surface portion of the first piezoelectric layer and fills the hole. According to the above configuration, it is possible to prevent intrusion of foreign substance such as water and to prevent generation of a leakage current. It is possible to prevent the piezoelectric element from being damaged due to concentration of stress in the hole. That is, it is possible to appropriately fill the hole on the inclined surface portion which is a surface of the first piezoelectric layer.

The piezoelectric element according to a second aspect of the present disclosure is directed to the first aspect, in which the second piezoelectric layer is disposed from the inclined surface portion to the flat surface portion.

According to the present aspect, the second piezoelectric layer is disposed from the inclined surface portion to the flat surface portion. Therefore, the hole on the flat surface portion which is the surface of the first piezoelectric layer can be appropriately filled in addition to the hole on the inclined surface portion.

The piezoelectric element according to a third aspect of the present disclosure is directed to the second aspect, in which the second electrode is formed at the second piezoelectric layer at a position in the first direction.

According to the present aspect, the second electrode is formed at the second piezoelectric layer at the position in the first direction. Therefore, the second piezoelectric layer is protected by the second electrode, and corrosion and damage of the second piezoelectric layer and the first piezoelectric layer can be prevented.

The piezoelectric element according to a fourth aspect of the present disclosure is directed to any one of the first aspect to the third aspect, in which a plurality of the first piezoelectric layers are provided, and the second electrode is a common electrode that applies a common voltage to the plurality of first piezoelectric layers.

According to the present aspect, the second electrode is the common electrode that applies a voltage to the plurality of first piezoelectric layers. Therefore, a configuration of the entire piezoelectric element can be simplified.

The piezoelectric element according to a fifth aspect of the present disclosure is directed to any one of the first to fourth aspects, in which the first piezoelectric layer is a piezoelectric layer formed by crystallizing a piezoelectric material in a liquid state.

According to the present aspect, the first piezoelectric layer is a piezoelectric layer formed using a so-called liquid phase method. When the piezoelectric layer is formed using the liquid phase method, the piezoelectric layer is easily formed, but a hole is more likely to be formed on the surface of the piezoelectric layer as compared with a case where the piezoelectric layer is formed using a so-called vapor phase method in which a piezoelectric material in a gaseous state, that is, a molecular state is attached. However, even when the piezoelectric layer is formed using the liquid phase method, it is possible to appropriately fill the hole on the surface of the piezoelectric layer.

The piezoelectric element according to a sixth aspect of the present disclosure is directed to any one of the first aspect to the fifth aspect, in which a crystal grain size of crystal grains constituting the second piezoelectric layer is smaller than a crystal grain size of crystal grains constituting the first piezoelectric layer.

The crystal grain size is an average grain size of crystals obtained using a product method, and specifically, is a square root of a value obtained by calculating a sum of a number A of crystal grains completely included in a predetermined measurement area W (for example, a long square of 1.5 μm in length×1.5 μm in width) and a value obtained by multiplying a number B of crystal grains placed on sides of the measurement area W by 0.5, and dividing the measurement area W by the sum A+0.5B.

According to the present aspect, the crystal grain size of the crystal grains constituting the second piezoelectric layer is smaller than the crystal grain size of the crystal grains constituting the first piezoelectric layer. Therefore, the thickness is small, and thus the hole can be blocked by making the crystal grains finer, so that the hole can be effectively filled.

The piezoelectric element according to a seventh aspect of the present disclosure is directed to any one of the first aspect to the sixth aspect, in which the first piezoelectric layer contains lead, zinc, and titanium, and the second piezoelectric layer contains lead, zinc, and titanium.

According to the present aspect, the first piezoelectric layer and the second piezoelectric layer both contain lead, zinc, and titanium. That is, the constituent material of the second piezoelectric layer is common to the constituent material of the first piezoelectric layer. Therefore, the second piezoelectric layer can have characteristics similar to those of the first piezoelectric layer, and peeling of the second piezoelectric layer from the first piezoelectric layer as the piezoelectric element is driven can be particularly effectively prevented.

A liquid droplet ejection head according to an eighth aspect of the present disclosure includes: a nozzle through which a liquid droplet is ejected; a pressure chamber that communicates with the nozzle; and the piezoelectric element according to any one of the first aspect to the seventh aspect, in which the substrate forms a part of a wall surface of the pressure chamber.

According to the present aspect, it is possible to appropriately eject a liquid by the liquid droplet ejection head including the piezoelectric element in which the hole on the surface of the piezoelectric layer is appropriately filled.

Hereinafter, embodiments of the present disclosure will be described with reference to accompanying drawings. In the drawings, when a recording apparatus 1 is disposed as shown in FIG. 1, an X-axis direction in the drawing is a horizontal direction, a Y-axis direction is a horizontal direction and is a direction orthogonal to the X-axis direction, and a Z-axis direction is a vertical direction.

First Embodiment

Recording Apparatus

First, the recording apparatus 1 according to a first embodiment including a liquid droplet ejection head 100, which is an example of the present disclosure, will be described with reference to FIG. 1. The recording apparatus 1 shown in FIG. 1 includes the liquid droplet ejection head 100 that ejects ink while reciprocating in a reciprocating movement direction B along the Y-axis direction, and forms an image on a medium P by moving the medium P with respect to the liquid droplet ejection head 100 in a transport direction A along the X-axis direction. However, the recording apparatus including the liquid droplet ejection head 100 according to the present disclosure is not limited to the recording apparatus having such a configuration. It is sufficient that the medium P and the liquid droplet ejection head 100 can be moved relative to each other to form the image on the medium P. Besides a configuration in which a single-cut medium such as a cut sheet is used as the medium P, another configuration may also be employed in which a long medium such as a roll sheet is used as the medium P.

Liquid Droplet Ejection Head

Figure 3:
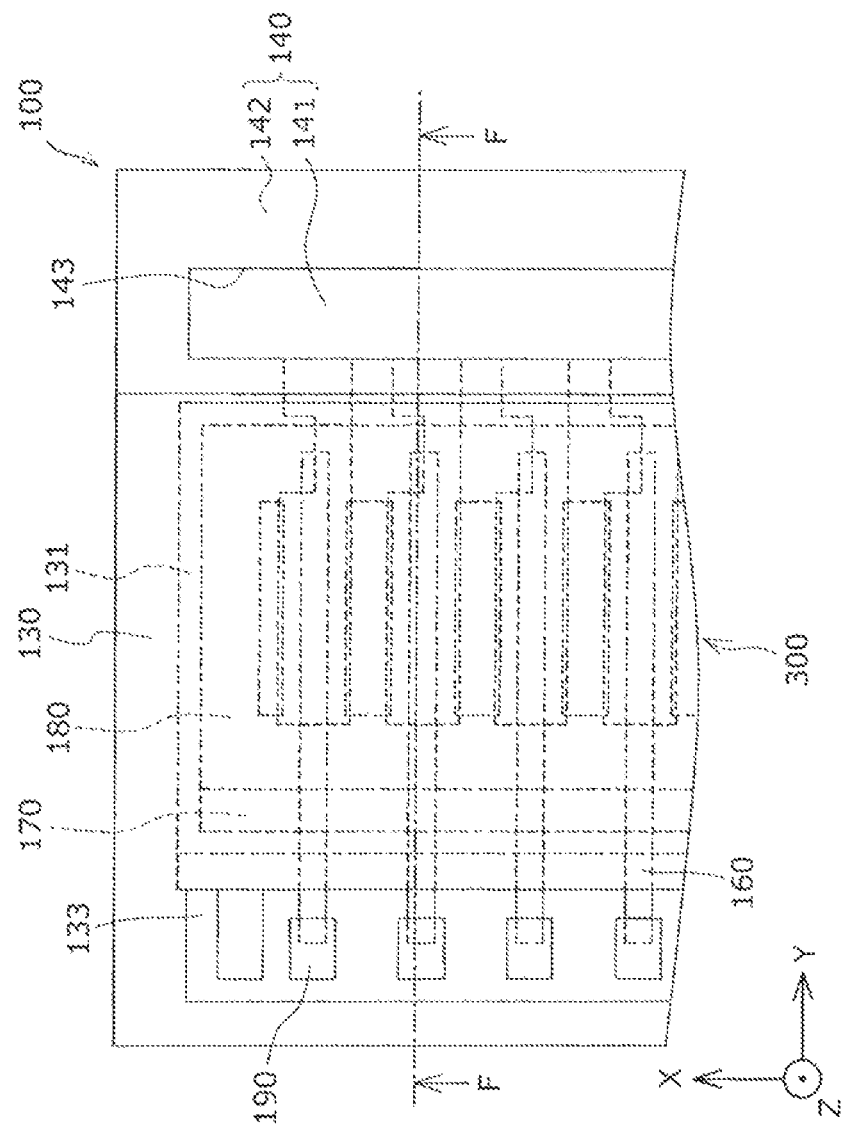
FIG. 3 is a plan view showing the liquid droplet ejection head of the recording apparatus in FIG. 1.
Figure 4:
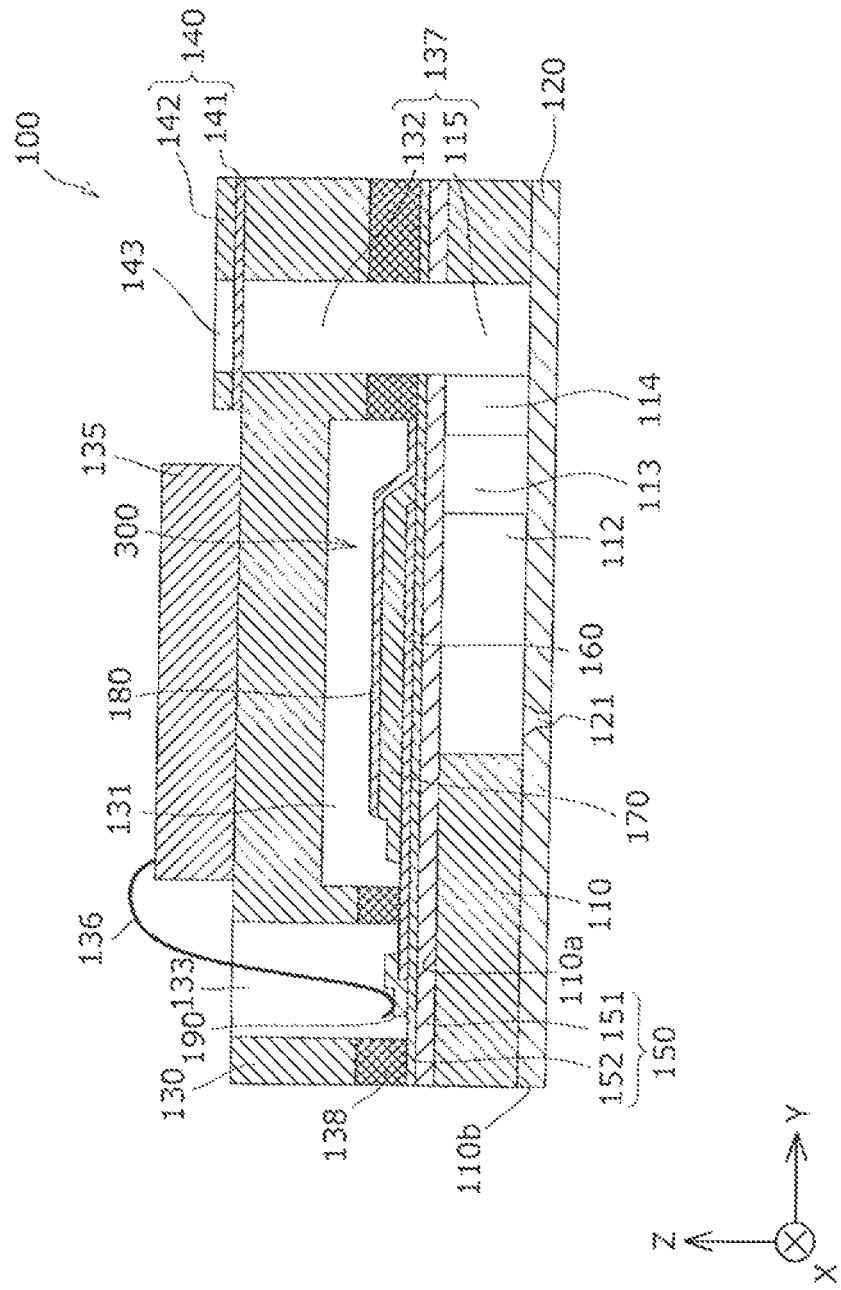
FIG. 4 is a cross-sectional view showing the liquid droplet ejection head of the recording apparatus in FIG. 1.

Next, the liquid droplet ejection head 100 will be described with reference to FIGS. 2 to 4. Here, FIG. 4 is a cross-sectional view taken along a line F-F in FIG. 3.

The liquid droplet ejection head 100 includes a substrate 110. The substrate 110 includes a first substrate surface 110a which is a surface in a +Z direction and a second substrate surface 110b which is a surface in a −Z direction. The +Z direction is a first direction, and the −Z direction is a second direction which is an opposite direction from the first direction. Pressure chambers 112 are formed at the substrate 110. The pressure chambers 112 partitioned by a plurality of partition walls 111 are arranged side by side, along the X-axis direction, with a plurality of nozzles 121 that eject ink of the same color.

Figure 2:
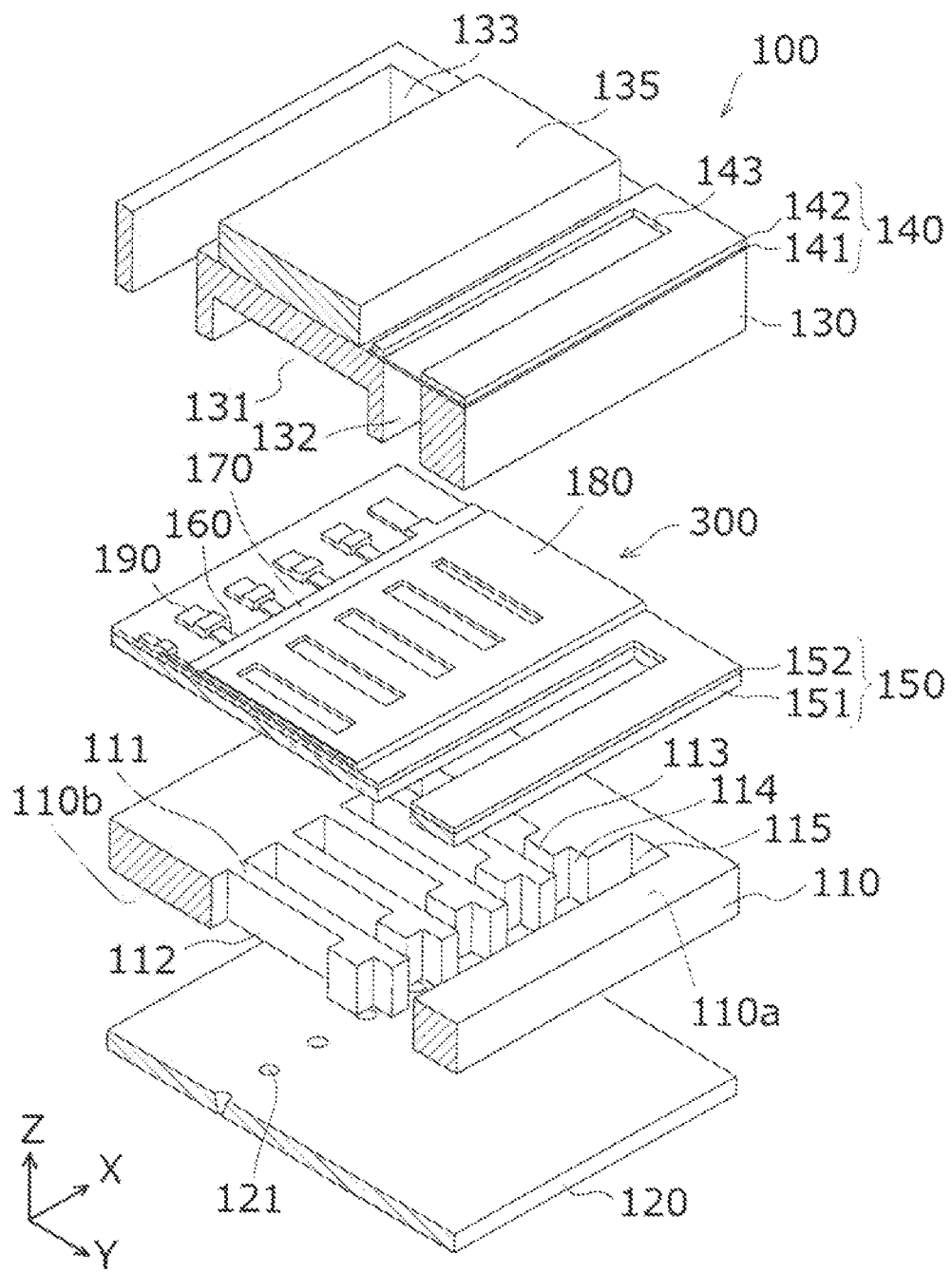
FIG. 2 is an exploded perspective view showing the liquid droplet ejection head of the recording apparatus in FIG. 1.

As shown in FIG. 2, at one end portion side of the pressure chambers 112 of the substrate 110 in the Y-axis direction, an ink supply path 113 whose opening area is reduced by narrowing one side of the pressure chambers 112 from the X-axis direction, and a communication path 114 having substantially the same width as the pressure chambers 112 in the X-axis direction are partitioned by the plurality of partition walls 111. As shown in FIG. 4, a communication portion 115 constituting a part of a manifold 137, which is a common ink chamber of the pressure chambers 112, is formed at an opposite side from the pressure chambers 112 in the Y-axis direction, which is an outside of the communication path 114. That is, liquid flow paths including the pressure chambers 112, the ink supply path 113, the communication path 114, and the communication portion 115 are formed at the substrate 110.

A nozzle plate 120, on which the nozzles 121 communicating with the pressure chambers 112 are bored, is bonded to the second substrate surface 110b of the substrate 110, that is, a surface where the liquid flow paths such as the pressure chambers 112 are opened, by an adhesive, a thermal welding film, or the like. The nozzles 121 are arranged side by side at the nozzle plate 120.

A diaphragm 150 is formed at the first substrate surface 110a of the substrate 110. The diaphragm 150 includes, for example, an elastic film 151 provided at the substrate 110 and an insulating film 152 provided at the elastic film 151. It is noted that the present disclosure is not limited to such a configuration, and a part of the substrate 110 may be processed to be thin to be used as the elastic film.

A piezoelectric element 300 including a first electrode 160, a piezoelectric layer 170, and a second electrode 180 is formed at the insulating film 152 via an adhesion layer formed of, for example, titanium. It is noted that the adhesion layer may be omitted. A detailed configuration of the piezoelectric element 300 will be described later.

In the present embodiment, the piezoelectric element 300 and the diaphragm 150 which is displaced by driving of the piezoelectric element 300 are collectively referred to as an actuator. The diaphragm 150 and the first electrode 160 act as a diaphragm, but the present disclosure is not limited thereto. Only the first electrode 160 may act as the diaphragm without providing either one or both of the elastic film 151 and the insulating film 152. The piezoelectric element 300 itself may substantially serve as the diaphragm. When the first electrode 160 is directly provided on the substrate 110, it is preferable to protect the first electrode 160 with an insulating protective film or the like so that the first electrode 160 and the ink are not conducted.

In such a piezoelectric element 300, generally, one of the first electrode 160 and the second electrode 180 is used as a common electrode, and the other electrode is used as an individual electrode by patterning for each of the pressure chambers 112. In the present embodiment, the first electrode 160 is an individual electrode and the second electrode 180 is a common electrode, but there is no problem even when the first electrode 160 and the second electrode 180 are reversed due to the convenience of a drive circuit 135 and a coupling wiring 136. In the present embodiment, the second electrode 180 is formed continuously over the plurality of pressure chambers 112 to serve as a common electrode.

The second electrode 180 is provided at an opposite side of the piezoelectric layer 170 from the first electrode 160. Materials of the first electrode 160 and the second electrode 180 are not particularly limited as long as the materials have electrical conductivity, and a noble metal such as platinum (Pt) or iridium (Ir) is suitably used.

At the substrate 110 at which the piezoelectric element 300 is provided, that is, at the diaphragm 150, the first electrode 160, and a lead electrode 190, a protective substrate 130 including a manifold portion 132 constituting at least a part of the manifold 137 is bonded by an adhesive 138. In the present embodiment, the manifold portion 132 penetrates the protective substrate 130 in a thickness direction, is formed over the width direction of the pressure chambers 112, and communicates with the communication portion 115 of the substrate 110 as described above to form the manifold 137 that serves as a common ink chamber of the pressure chambers 112. The communication portion 115 of the substrate 110 may be divided into a plurality of portions for the pressure chambers 112, and only the manifold portion 132 may be used as the manifold. Further, for example, only the pressure chambers 112 may be provided at the substrate 110, and the ink supply path 113 communicating the manifold and the pressure chambers 112 may be provided at the elastic film 151 and the insulating film 152 that are interposed between the substrate 110 and the protective substrate 130.

The protective substrate 130 is provided with a piezoelectric element holding portion 131 having a space that does not interfere with a movement of the piezoelectric element 300 in a region facing the piezoelectric element 300. It is sufficient that the piezoelectric element holding portion 131 has the space that does not interfere with the movement of the piezoelectric element 300, and the space may be sealed or may not be sealed. The drive circuit 135 functioning as a signal processing unit is fixed at the protective substrate 130. As the drive circuit 135, for example, a circuit substrate or a semi-conductor integrated circuit (IC) can be used, and is coupled to a control unit (not shown) of the recording apparatus 1. The drive circuit 135 and the lead electrode 190 can be electrically coupled to each other via the coupling wiring 136 formed of an electrical conductivity wire such as a bonding wire inserted through a through hole 133.

A compliance substrate 140 including a sealing film 141 and a fixing plate 142 is bonded to the protective substrate 130. The sealing film 141 is formed of a material having low rigidity, and one surface of the manifold portion 132 is sealed by the sealing film 141. The fixing plate 142 may be formed of a hard material such as metal. Since a region of the fixing plate 142 facing the manifold 137 is an opening portion 143 in which the sealing film 141 is completely removed in the thickness direction, one surface of the manifold 137 is sealed only by the sealing film 141 having flexibility.

Piezoelectric Element

Figure 7:
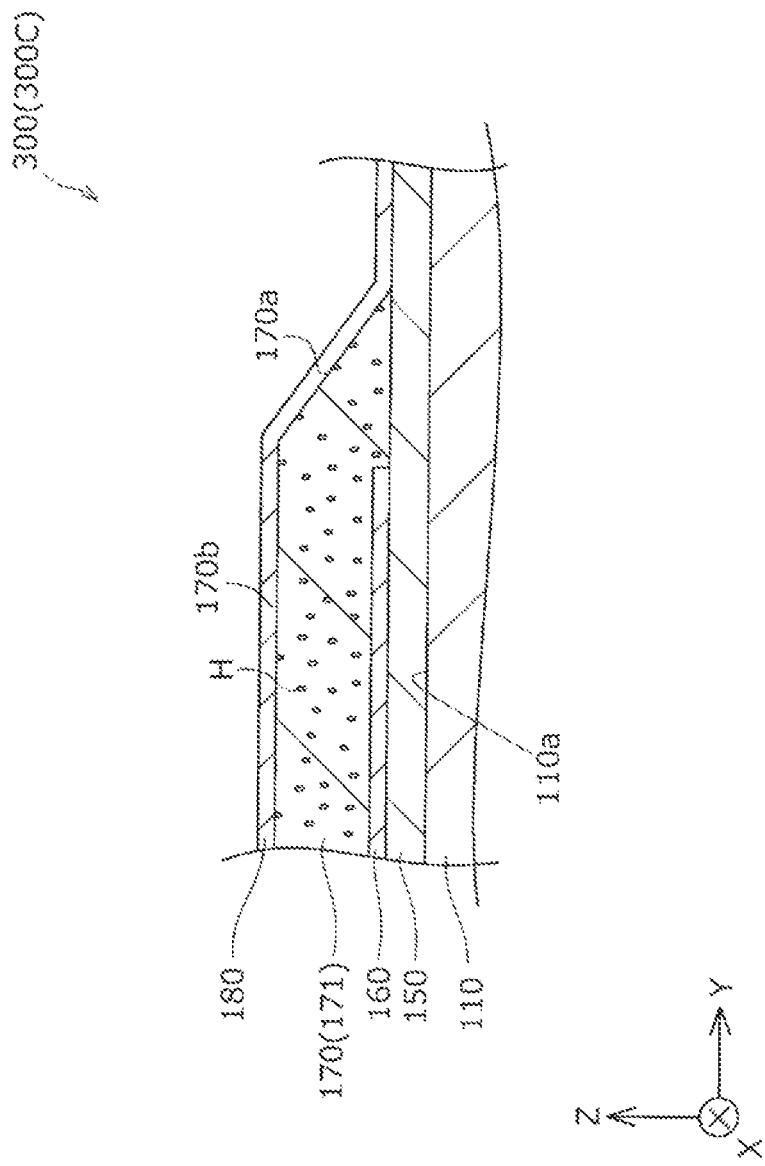
FIG. 7 is a cross-sectional view showing an example of a piezoelectric element provided in a recording apparatus in the related art.

Next, details of a piezoelectric element 300A according to the present embodiment, which is the piezoelectric element 300, will be described with reference to FIG. 5 and in comparison with a piezoelectric element in FIG. 7. The piezoelectric element in FIG. 7 is an example of a piezoelectric element 300C used in a recording apparatus in the related art.

As described above, the piezoelectric element 300A according to the present embodiment includes the substrate 110, the first electrode 160 formed at the first substrate surface 110a of the substrate 110, the piezoelectric layer 170, and the second electrode 180. Here, at least a part of the piezoelectric layer 170 is formed in the first direction (+Z direction) of the first electrode 160 as shown in FIG. 5. The piezoelectric layer 170 includes a first piezoelectric layer 171 having a flat surface portion 170b along the first substrate surface 110a and an inclined surface portion 170a inclined with respect to the flat surface portion 170b, and a second piezoelectric layer 172 that is formed at the inclined surface portion 170a and that has a thickness L2 smaller than a thickness L1 of the flat surface portion 170b of the first piezoelectric layer 171. Further, the second electrode 180 is formed at at least the flat surface portion 170b. The meaning of "formed at" includes not only a configuration of being directly formed on a target member but also a configuration of being formed at the target member via other members, such as a configuration in which the first electrode 160 according to the present embodiment is formed at the first substrate surface 110a via the diaphragm 150.

Figure 5:
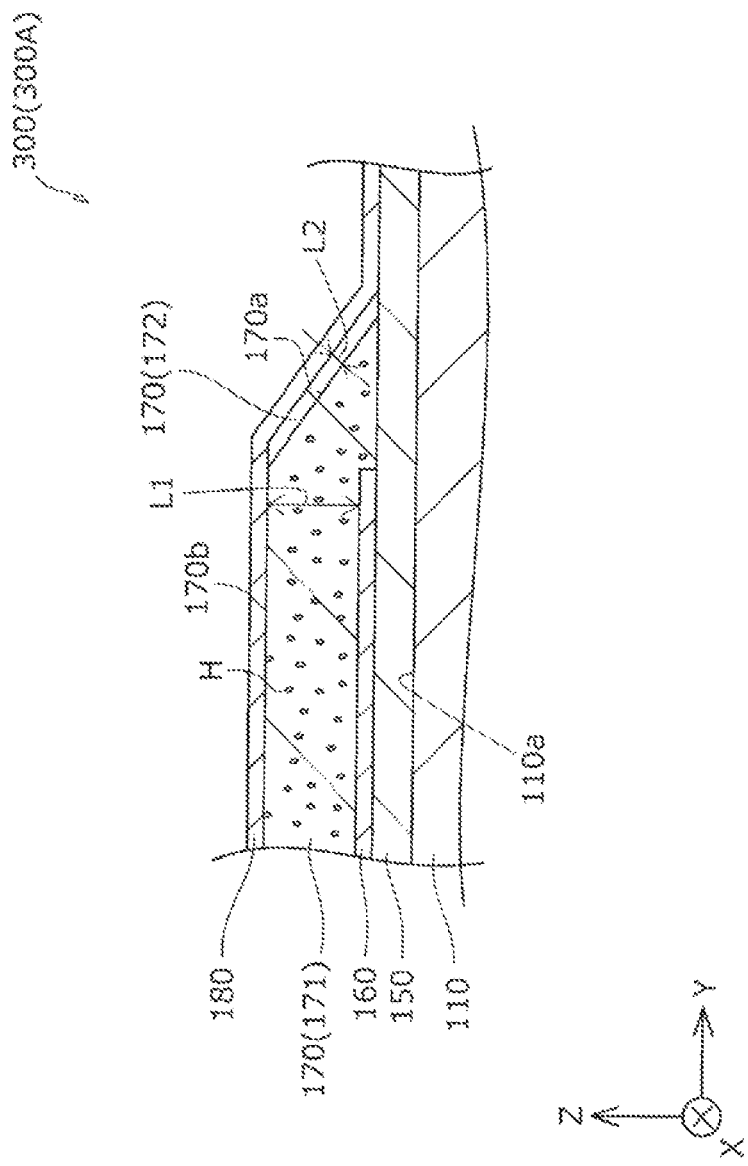
FIG. 5 is a cross-sectional view showing a piezoelectric element of the liquid droplet ejection head in FIGS. 2 and 3.

As shown in FIG. 5, holes H may be formed on the piezoelectric layer 170 when the piezoelectric layer 170 is formed or patterned. At the time of manufacturing the piezoelectric element 300 or the like, foreign substance such as water may intrude into the holes H formed on the surface of the piezoelectric layer 170. When the foreign substance such as water intrudes into the holes H on the surface of the piezoelectric layer 170, a leakage current may be generated when the piezoelectric element 300 is driven, or the piezoelectric element 300 may be damaged due to peeling of the second electrode 180 from the piezoelectric layer 170. In particular, when the piezoelectric layer 170 has the inclined surface portion 170a as in the piezoelectric element 300A according to the present embodiment, the second electrode 180 at the inclined surface portion 170a is likely to be peeled off from the piezoelectric layer 170.

However, in the piezoelectric element 300A according to the present embodiment, the inclined surface portion 170a of the first piezoelectric layer 171 is covered with the second piezoelectric layer 172 having the thickness L2 smaller than the thickness L1 of the flat surface portion 170b of the first piezoelectric layer 171. When the thickness of the piezoelectric layer 170 is increased, the holes H are likely to be generated, and when the thickness of the piezoelectric layer 170 is decreased, the holes H are unlikely to be generated. In order to appropriately drive the piezoelectric element 300, the piezoelectric layer 170 having a predetermined thickness is required. However, by covering the surface of the thick piezoelectric layer 170 with a thin piezoelectric layer, it is possible to prevent new holes H from being generated on the surface of the thin piezoelectric layer 170 at a covering side while the holes H on the surface of the thick piezoelectric layer 170 at a covered side are filled. That is, the constituent material of the second piezoelectric layer 172 can appropriately intrude into the holes H on the inclined surface portion 170a by covering the inclined surface portion 170a with the second piezoelectric layer 172 thinner than the first piezoelectric layer 171. The constituent material of the second piezoelectric layer 172 intrudes into the holes H and the holes H is filled with the constituent material, so that it is possible to prevent intrusion of the foreign substance such as water into the holes H and to prevent generation of a leakage current.

In the present embodiment, the first piezoelectric layer 171 and the second piezoelectric layer 172 are both formed of lead zirconate titanate (PZT). That is, not only the first piezoelectric layer 171 but also the second piezoelectric layer 172 serves as the piezoelectric layer 170. In this way, by covering the first piezoelectric layer 171 which is the piezoelectric layer 170 with the second piezoelectric layer 172 which is the piezoelectric layer 170, it is possible to prevent the piezoelectric layer 170 from being distorted as the piezoelectric element 300 is driven, and it is possible to prevent the piezoelectric layer 170 and the like from being damaged as the piezoelectric element 300 is driven. That is, in the piezoelectric element 300A according to the present embodiment, the holes H on the inclined surface portion 170a, which is the surface of the first piezoelectric layer 171, can be appropriately filled. This is because distortion can be prevented using piezoelectric layers having similar Young's modulus.

On the other hand, as shown in FIG. 7, in the general piezoelectric element 300C in the related art, the piezoelectric layer 170 is a single layer, and the holes H is formed on the inclined surface portion 170a which is the surface. Therefore, a leakage current is likely to be generated from the inclined surface portion 170a, and the second electrode 180 at the inclined surface portion 170a is likely to be peeled off. The stress is concentrated on the holes H on the inclined surface portion 170a as the piezoelectric element 300C is driven, and the piezoelectric layer 170 is likely to be damaged.

As described above, the liquid droplet ejection head 100 according to the present embodiment includes the nozzles 121 through which a liquid droplet is ejected and the pressure chambers 112 that communicate with the nozzles 121 in addition to such piezoelectric elements 300A. The substrate 110 of the piezoelectric elements 300A forms a part of the wall surface of the pressure chambers 112. As described above, the liquid discharge head 100 according to the present embodiment includes the piezoelectric element 300 in which the holes H on the surface of the piezoelectric layer 170 are appropriately filled, and thus it is possible to appropriately eject ink which is a liquid.

As shown in FIG. 5, the second electrode 180 is formed at the second piezoelectric layer 172 at a position in the first direction (+Z direction). Therefore, since the second piezoelectric layer 172 is protected by the second electrode 180 and the first piezoelectric layer 171 is also protected by the second electrode 180, the piezoelectric element 300A according to the present embodiment can prevent corrosion and damage of the second piezoelectric layer 172 and the first piezoelectric layer 171.

Here, as described above, in the piezoelectric element 300A according to the present embodiment, the second electrode 180 is a common electrode. Specifically, the piezoelectric element 300A according to the present embodiment includes a plurality of first piezoelectric layers 171, and the second electrode 180 is a common electrode that applies a common voltage to the plurality of first piezoelectric layers 171. The piezoelectric element 300A according to the present embodiment has such a configuration, thereby simplifying the configuration of the entire piezoelectric element. It is noted that the second electrode 180 may be an individual electrode for each of the plurality of first piezoelectric layers 171, and the first electrode 160 may be a common electrode.

Here, the first piezoelectric layer 171 is a piezoelectric layer formed by crystallizing a piezoelectric material in a liquid state. That is, the first piezoelectric layer 171 is the piezoelectric layer 170 formed using the so-called liquid phase method. When the piezoelectric layer 170 is formed using the liquid phase method, the piezoelectric layer 170 is easily formed, but the holes H are more likely to be formed on the surface of the piezoelectric layer 170 as compared with a case where the piezoelectric layer 170 is formed using the so-called vapor phase method in which a piezoelectric material in a gaseous state, that is, a molecular state is attached. However, since the piezoelectric element 300A according to the present embodiment has the configuration described above, even when the piezoelectric layer 170 is formed using the liquid phase method, the holes H on the surface of the piezoelectric layer 170 are appropriately filled.

In the piezoelectric element 300A according to the present embodiment, the second piezoelectric layer 172 is also formed using the liquid phase method. It is noted that it goes without saying that the first piezoelectric layer 171 and the second piezoelectric layer 172 may be formed using the vapor phase method. Here, a preferable film thickness of the first piezoelectric layer is 300 nm or more and 5000 nm or less, and a preferable number of layers of the first piezoelectric layer is 2 or more and 25 or less. On the other hand, a preferable film thickness of the second piezoelectric layer is 10 nm or more and 100 nm or less, and a preferable number of layers of the second piezoelectric layer is 8 or more and 18 or less.

Here, the thickness L1 of the first piezoelectric layer 171 can be determined without particular limitation in accordance with the characteristics required for the piezoelectric element 300. On the other hand, the thickness L2 of the second piezoelectric layer 172 is preferably 5 nm or more and 100 nm or less. This is because, the holes H on the surface of the first piezoelectric layer 171 can be suitably filled by setting the thickness L2 in such a range. The thickness L2 is particularly preferably 50 nm or less.

In the piezoelectric element 300A according to the present embodiment, the crystal grain size of the crystal grains constituting the second piezoelectric layer 172 is smaller than the crystal grain size of the crystal grains constituting the first piezoelectric layer 171. Therefore, the piezoelectric element 300A according to the present embodiment has a thin thickness, and thus the holes H can be blocked by making the crystal grains finer, so that the holes H are effectively filled. A preferable range of the crystal grain size of the crystal grains constituting the first piezoelectric layer 171 is 50 nm or more and 200 nm or less. On the other hand, a preferable range of the crystal grain size of the crystal grains constituting the second piezoelectric layer 172 is 10 nm or more and 50 nm or less.

As described above, the first piezoelectric layer 171 and the second piezoelectric layer 172 are both formed of PZT. In other words, the first piezoelectric layer 171 and the second piezoelectric layer 172 both contain lead, zirconium, and titanium. Thus, the constituent material of the second piezoelectric layer 172 is preferably common to the constituent material of the first piezoelectric layer 171. This is because the second piezoelectric layer 172 can have the characteristics similar to those of the first piezoelectric layer 171, and the peeling of the second piezoelectric layer 172 from the first piezoelectric layer 171 as the piezoelectric element 300 is driven can be particularly effectively prevented. It is noted that, as long as both the first piezoelectric layer 171 and the second piezoelectric layer 172 can serve as the piezoelectric layer, the constituent materials of the first piezoelectric layer 171 and the second piezoelectric layer 172 may not be common.

In a case of a configuration in which a resin layer is disposed instead of the second piezoelectric layer 172, it is difficult to appropriately fill the holes H on the inclined surface portion 170a which is the surface of the first piezoelectric layer 171 as in the piezoelectric element 300A according to the present embodiment. This is because the resin layer is likely to be peeled off from the piezoelectric layer 170 as the piezoelectric element 300 is driven. However, in a case of a configuration in which not a resin but an LaNiO₃ (LNO) layer or a zirconia layer is disposed instead of the second piezoelectric layer 172, although not as good as the piezoelectric element 300A according to the present embodiment, it is possible to appropriately fill the holes H on the inclined surface portion 170a which is the surface of the first piezoelectric layer 171.

Regarding relation between the Young's modulus of the first piezoelectric layer 171 and the Young's modulus of the second piezoelectric layer 172, it is preferable that the Young's modulus of the second piezoelectric layer 172 is equal to or greater than the Young's modulus of the first piezoelectric layer 171. Further, the Young's modulus of the second electrode 180 is preferably greater than the Young's modulus of the second piezoelectric layer 172. This is because the driving of the piezoelectric element 300 can be made particularly suitable. In the piezoelectric element 300A according to the present embodiment, the Young's modulus of the first piezoelectric layer 171 and the second piezoelectric layer 172 which are formed of PZT is 84 GPa, and the Young's modulus of the second electrode 180 is 200 GPa, which satisfy the above relation. As a method for measuring Young's modulus, for example, as a static measurement method, a method of applying a static load such as tension or compression, bending, or torsion to a test piece and measuring stress and strain to obtain an elastic modulus can be adopted. For example, as a resonance method, a method of causing a sample to undergo free vibration or forced vibration and measuring natural vibration thereof to obtain an elastic modulus can be adopted. The above value is a value measured using the static measurement method.

Since the Young's modulus of the second piezoelectric layer 172 when LNO is used for the second piezoelectric layer 172 is 120 GPa, the above relation is also satisfied when LNO is used for the second piezoelectric layer 172 instead of PZT in the piezoelectric element 300A according to the present embodiment. Similarly, since the Young's modulus of the second piezoelectric layer 172 when zirconia is used for the second piezoelectric layer 172 is 190 GPa, the above relation is also satisfied when zirconia is used for the second piezoelectric layer 172 instead of PZT in the piezoelectric element 300A according to the present embodiment.

Second Embodiment

Figure 6:
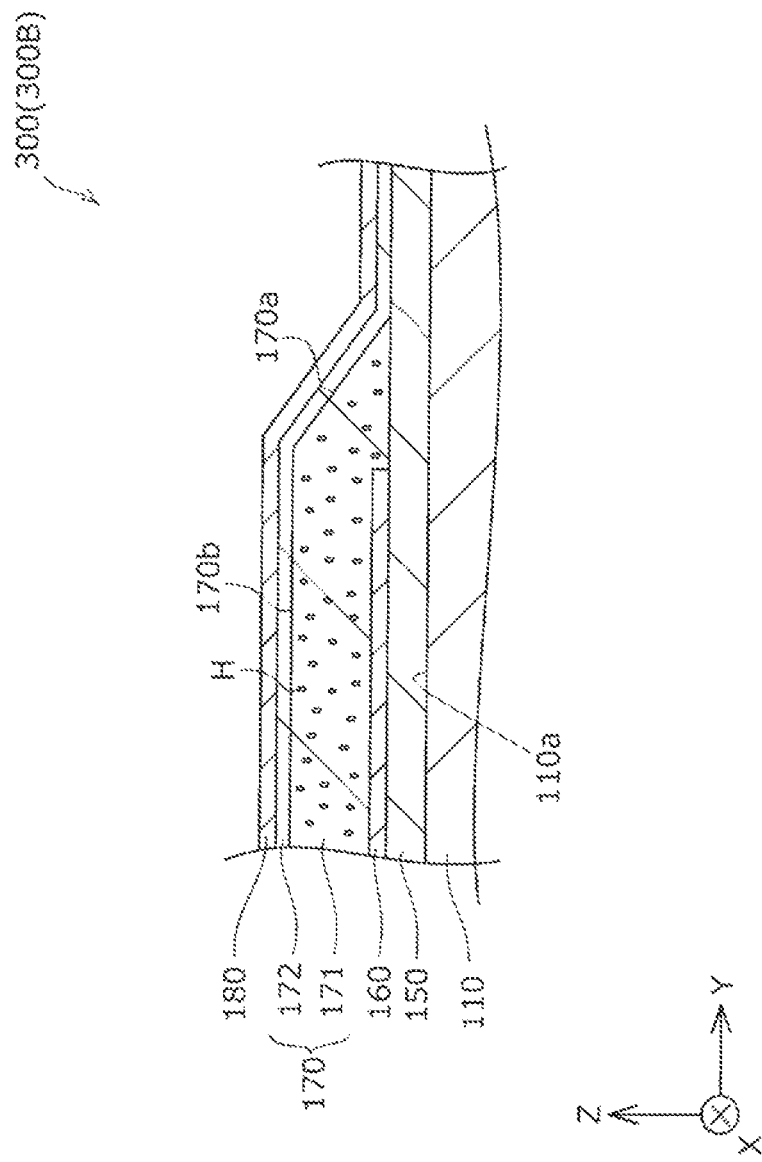
FIG. 6 is a cross-sectional view showing a piezoelectric element provided in a recording apparatus according to a second embodiment.

Hereinafter, a recording apparatus according to a second embodiment will be described with reference to FIG. 6. FIG. 6 corresponds to FIG. 5 in the recording apparatus 1 according to the first embodiment, and the same components as those according to the first embodiment in FIG. 5 are denoted by the same reference numerals and a detailed description thereof will be omitted. Here, the recording apparatus according to the present embodiment has the same characteristics as those of the recording apparatus 1 according to the first embodiment described above, and has the same configuration as that of the recording apparatus 1 according to the first embodiment except for the following description. Specifically, a configuration is the same as that of the recording apparatus 1 according to the first embodiment except for a configuration of the second piezoelectric layer 172 in the piezoelectric element 300. Therefore, the description of the recording apparatus 1 according to the first embodiment with reference to FIGS. 1 to 4 applies to the recording apparatus according to the present embodiment.

As shown in FIG. 5, in the piezoelectric element 300A of the recording apparatus 1 according to the first embodiment, the second piezoelectric layer 172 is formed only at the inclined surface portion 170a. On the other hand, as shown in FIG. 6, in the piezoelectric element 300B of the recording apparatus according to the present embodiment, the second piezoelectric layer 172 is disposed not only at the inclined surface portion 170a but also from the inclined surface portion 170a to the flat surface portion 170b. Therefore, in the piezoelectric element 300B according to the present embodiment, the holes H on the flat surface portion 170b in addition to the inclined surface portion 170a are appropriately filled.

The present disclosure is not limited to the embodiments described above, and can be implemented in various configurations without departing from the scope of the disclosure. In order to solve a part or all of problems described above, or to achieve a part or all of effects described above, technical characteristics according to the embodiments corresponding to the technical characteristics according to each embodiment described in the summary of the disclosure can be replaced or combined as appropriate. If the technical characteristics are not described as essential in the present description, the technical characteristics can be deleted as appropriate.

What is claimed is:

1. A piezoelectric element, comprising:
a substrate;
a first electrode formed at a first substrate surface of the substrate in a first direction;
a first piezoelectric layer that is formed at the first electrode and that includes an upper surface as a flat surface portion along the first substrate surface, a lower surface extending in parallel with the upper surface, and an inclined surface portion that connects the upper surface and the lower surface that is inclined from the upper surface in a direction toward the first substrate surface;
a second piezoelectric layer provided on the inclined surface portion that extends between the upper surface and the lower surface along and in parallel with the inclined surface portion such that the second piezoelectric layer is also inclined toward the first substrate surface and whose thickness is smaller than a thickness of the first piezoelectric layer, the second piezoelectric layer having a first terminal end that terminates at the transition between the upper surface and the inclined surface portion of the piezoelectric layer, and having a second terminal end that terminates at the location where the inclined surface portion meets the lower surface of the first piezoelectric layer; and
a second electrode formed at least at the flat surface portion.

2. The piezoelectric element according to claim 1, wherein
the second electrode is formed at the second piezoelectric layer.

3. The piezoelectric element according to claim 1, wherein
a plurality of the first piezoelectric layers are provided, and
the second electrode is a common electrode that applies a common voltage to the plurality of first piezoelectric layers.

4. The piezoelectric element according to claim 1, wherein
the first piezoelectric layer is a piezoelectric layer formed by crystallizing a piezoelectric material in a liquid state.

5. The piezoelectric element according to claim 1, wherein
a crystal grain size of crystal grains constituting the second piezoelectric layer is smaller than a crystal grain size of crystal grains constituting the first piezoelectric layer.

6. The piezoelectric element according to claim 1, wherein
the first piezoelectric layer contains lead, zinc, and titanium, and
the second piezoelectric layer contains lead, zinc, and titanium.

7. A liquid droplet ejection head comprising:
a nozzle through which a liquid droplet is ejected;
a pressure chamber that communicates with the nozzle;
and the piezoelectric element according to claim 1, wherein
the substrate forms a part of a wall surface of the pressure chamber.

* * * * *